United States Patent
Kim (10) Patent No.: US 8,916,891 B2
(45) Date of Patent: Dec. 23, 2014

(54) LIGHT EMITTING DEVICE, LIGHT EMITTING DEVICE PACKAGE, METHOD OF MANUFACTURING LIGHT EMITTING DEVICE, AND LIGHTING SYSTEM

(75) Inventor: Sun Kyung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 779 days.

(21) Appl. No.: 12/908,939

(22) Filed: Oct. 21, 2010

(65) Prior Publication Data
US 2011/0204397 A1    Aug. 25, 2011

(30) Foreign Application Priority Data
Feb. 23, 2010 (KR) .................. 10-2010-0016044

(51) Int. Cl.
*H01L 33/00* (2010.01)
*H01L 33/40* (2010.01)
*H01L 33/20* (2010.01)

(52) U.S. Cl.
CPC .............. *H01L 33/20* (2013.01); *H01L 33/405* (2013.01)
USPC .................................. 257/98; 257/E33.068

(58) Field of Classification Search
None
See application file for complete search history.

(56) References Cited

U.S. PATENT DOCUMENTS

| | | | |
|---|---|---|---|
| 5,397,920 A * | 3/1995 | Tran | 257/749 |
| 2004/0113168 A1* | 6/2004 | Eliashevich et al. | 257/99 |
| 2005/0087884 A1* | 4/2005 | Stokes et al. | 257/778 |
| 2008/0042149 A1 | 2/2008 | Ho | |
| 2008/0142824 A1* | 6/2008 | Chen et al. | 257/98 |
| 2008/0142825 A1 | 6/2008 | Shih-Peng | |
| 2008/0169479 A1 | 7/2008 | Zhen-Feng | |
| 2009/0078951 A1 | 3/2009 | Hisayuki | |
| 2009/0127575 A1* | 5/2009 | Horng et al. | 257/98 |
| 2009/0261370 A1 | 10/2009 | Jeong | |
| 2010/0181586 A1 | 7/2010 | Kim | |
| 2010/0219434 A1 | 9/2010 | Kim | |
| 2011/0024784 A1 | 2/2011 | Song | |

FOREIGN PATENT DOCUMENTS

| | | |
|---|---|---|
| EP | 2211393 A2 | 7/2010 |
| EP | 2228836 A2 | 9/2010 |
| KR | 10-2008-0027584 A | 3/2008 |
| KR | 10-2008-0058954 A | 6/2008 |
| KR | 10-2008-0061693 A | 7/2008 |
| KR | 10-2009-0106301 | 10/2009 |

* cited by examiner

*Primary Examiner* — Michael Lebentritt
*Assistant Examiner* — Kevin Quinto
(74) *Attorney, Agent, or Firm* — McKenna Long & Aldridge LLP

(57) ABSTRACT

A light emitting device includes a first light extraction structure including a reflective layer and a pattern; an ohmic layer on the first light extraction structure; a second conductive type semiconductor layer on the ohmic layer; an active layer on the second conductive type semiconductor layer; and a first conductive type semiconductor layer on the active layer, wherein the pattern has a refractive index that is higher than that of air and lower than that of the second conductive type semiconductor layer.

15 Claims, 8 Drawing Sheets

LIGHT EMITTING DEVICE, LIGHT EMITTING DEVICE PACKAGE, METHOD OF MANUFACTURING LIGHT EMITTING DEVICE, AND LIGHTING SYSTEM

CROSS-REFERENCE TO RELATED APPLICATIONS

The present application claims priority under 35 U.S.C. §119(a) of Korean Patent Application No. 10-2010-0016044 filed on Feb. 23, 2010, which is hereby incorporated by reference in its entirety for all purposes as if fully set forth herein.

BACKGROUND

A light emitting diode (LED) is a semiconductor light emitting device that converts current into light.

Wavelengths of light emitted by the LED may vary according to semiconductor materials. This is because the emitted wavelengths of light are determined by band-gaps of semiconductor materials, which represent energy difference between electrons of a valence band and electrons of a conduction band.

Recently, research for improving the brightness of LEDs has been actively conducted. As a result, LEDs are now used as various kinds of light sources for displays, cars and general lighting. Furthermore, LEDs that efficiently emit excellent white color light by using fluorescent materials or combining LEDs of various colors may be realized.

SUMMARY

Embodiments provide a light emitting device with a new structure, a light emitting device package, a light emitting device manufacturing method, and a lighting system.

Embodiments also provide a light emitting device with an improved light emitting efficiency, a light emitting device package, a light emitting device manufacturing method, and a lighting system.

In one embodiment, a light emitting device includes: a first light extraction structure including a reflective layer and a pattern; an ohmic layer on the first light extraction structure; a second conductive type semiconductor layer on the ohmic layer; an active layer on the second conductive type semiconductor layer; and a first conductive type semiconductor layer on the active layer, wherein the pattern has a refractive index that is higher than that of air and lower than that of the second conductive type semiconductor layer.

In another embodiment, a method of manufacturing a light emitting device includes: forming a first conductive type semiconductor layer, an active layer, and a second conductive type semiconductor layer; forming an ohmic layer on the second conductive type semiconductor layer; forming a first light extraction structure including a reflective layer and a pattern, wherein the pattern has a refractive index that is higher than that of air and lower than that of the second conductive type semiconductor layer.

Further, in another embodiment, a light emitting device package includes: a package body; a first electrode layer and a second electrode layer installed at the package body; and a light emitting device connected electrically to the first electrode layer and the second electrode layer.

In still further another embodiment, a lighting system includes: a substrate; and a light emitting module including a light emitting device installed at the substrate.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are shown in the accompanying drawings. In the following description, it will be understood that when a layer (or film) is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In addition, it will also be understood that when a layer is referred to as being "between" two layers, it can be the only layer between the two layers, or one or more intervening layers may also be present.

In the figures, the dimensions of layers and regions are exaggerated for clarity of illustration. In addition, the dimension of each part does not reflect an actual size.

Hereinafter, with reference to the accompanying drawings, a light emitting device, a method of manufacturing the same, and a light emitting device package will be described.

Figure 1:
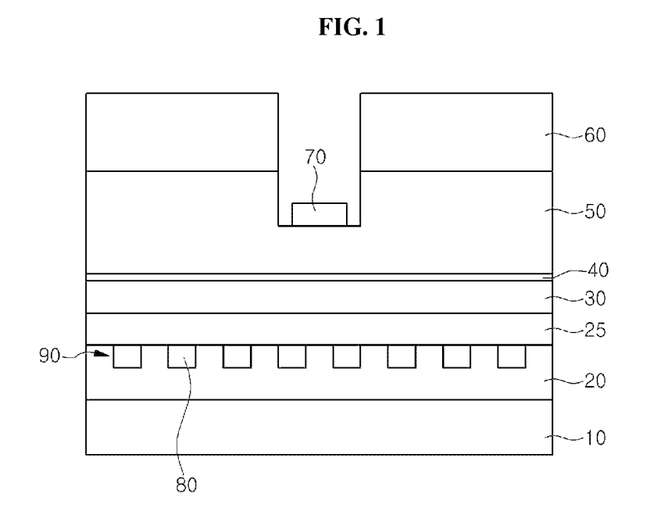
FIG. 1 is a cross-sectional view of a light emitting device according to a first embodiment.

FIG. 1 is a cross-sectional view of a light emitting device according to a first embodiment.

Referring to FIG. 1, the light emitting device according to the first embodiment includes a second electrode layer 10, a reflective layer 20 on the second electrode layer 10, a pattern 80 on the reflective layer 20, an ohmic layer 25 on the reflective layer 20 and the pattern 80, a second conductive type semiconductor layer 30 on the ohmic layer 25, an active layer 40 on the second conductive type semiconductor layer 30, a first conductive type semiconductor layer 50 on the active layer 40, and a first electrode layer 70 on the first conductive type semiconductor layer 50.

In addition, an un-doped semiconductor layer 60 may be formed on the first conductive type semiconductor layer 50.

In more detail, the second electrode layer 10 may be formed with at least one of semiconductor substrates (for example, Si, Ge, GaAs, ZnO, SiC, SiGe, GaN) into which Cu, Ti, Cr, Ni, Al, Pt, Mo, Au, W, or impurity is implanted. Along with the first electrode layer 70, the second electrode layer 10 may provide power to the active layer 40.

The reflective layer 20 may be formed on the second electrode layer 10. The reflective layer 20 may partially face the second conductive type semiconductor layer 30 and may be formed of metal or alloy, which includes at least one of Ag, Al, Pd, and Pt of a high reflectivity.

Moreover, a junction metal layer (not shown) including Ni and Ti may be formed between the second electrode layer 10 and the reflective layer 20 in order to enhance the interfacial adhesion between the two layers.

The pattern 80 is formed in the reflective layer 20 and below the ohmic layer 25. At least a portion of the side of the pattern 80 may be formed being surrounded by the reflective layer 20.

The pattern 80 and the reflective layer 20 form a light extraction structure 90.

The light extraction structure 90 may contribute to improving the light extraction efficiency of the light emitting device through diffraction effect. That is, the light extraction structure 90 has a form where the pattern 80 and the reflective layer 20 of respectively different refractive indices are periodically arranged, such that when light is incident, strong diffraction effect may occur due to a refractive index difference between the pattern 80 and the reflective layer 20.

The pattern 80 may be formed of a nonmetallic material. After forming of a nonmetallic layer on the second conductive type semiconductor layer 30 during a manufacturing process of a light emitting device, the pattern 80 is formed by patterning the nonmetallic layer. Or, after forming a mask pattern that corresponds to the pattern 80, the pattern 80 may be formed by performing a deposition or plating process along the mask pattern. Or, the pattern 80 may be formed with a roughened layer by wet-etching a nonmetallic pattern layer.

The pattern 80 may be formed of a translucent electrode and may be formed of at least one of ITO, ZnO, GZO, $RuO_x$, and $IrO_x$.

Moreover, the pattern 80 may be formed of a dielectric and may be formed of at least one of $SiO_2$, $MgF_2$, $TiO_2$, $Al_2O_3$, SOG, and $Si_3N_4$. If the pattern 80 is formed of a dielectric, since current does not flow through the pattern 80, a phenomenon that the current is biased to the shortest distance between the second electrode layer 10 and the first electrode layer 70 is alleviated, such that light emitting efficiency of the light emitting device can be improved. For this, the pattern 80 may partially overlap the first electrode layer 70 in a vertical direction.

As shown in FIG. 1, the patterns 80 may be spaced a predetermined interval apart from each other. That is, the reflective layer 20 may be arranged by a predetermined interval in a region that is disposed on the same horizontal plane as the pattern 80. Therefore, the ohmic layer 30 may partially contact the reflective layer 20.

Moreover, the pattern 80 may be formed with a refractive index that is higher than that of air (n=1) and lower than that of the second conductive type semiconductor layer 30. In addition, the pattern 80 may be formed with a refractive index that is less than that of the ohmic layer 25.

Figure 2:
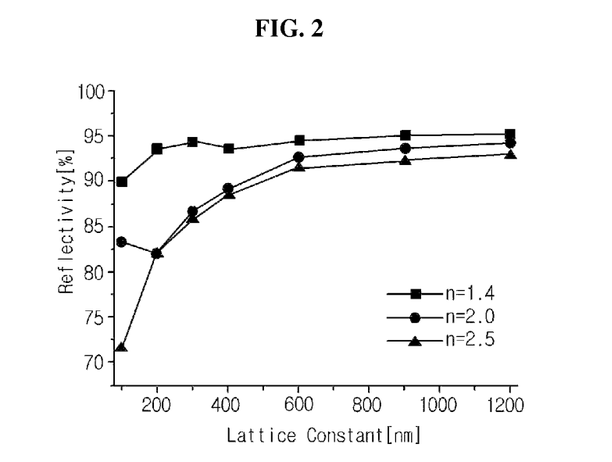
FIG. 2 is a graph illustrating a change of reflectivity of the light emitting device according to a refractive index of the pattern.

FIG. 2 is a graph illustrating a change of reflectivity of the light emitting device according to a refractive index of the pattern 80. The x-axis of FIG. 2 represents a lattice constant of the pattern 80 and its y-axis represents reflectivity of the light extraction structure 90. Except for the material of the pattern 80, all components are the same. In more detail, a case that the ohmic layer 25 has a thickness of 100 nm and the pattern 80 has a thickness of 0.1 µm will be exemplified.

Referring to FIG. 2, it is shown that as the refractive index of the pattern 80 gets lower, reflectivity of the light extraction structure 90 is improved more. That is, when the refractive index of the pattern 80 is 1.4, it has higher reflectivity compared to a refractive index of 2.0 or 2.5. Thus, the pattern 80 has a lower refractive index than the ohmic layer 25.

Especially, it is noted that in a region where a period of the pattern 80 is less than 200 nm to 600 nm, reflectivity is drastically improved when the refractive index of the pattern 80 is low (for example, 1.4). This means that light extraction efficiency of a lower wavelength range, i.e., low order guided mode, can be improved when the pattern 80 is formed of a material with a low refractive index. That is, in the case of light having a low wavelength range, a loss ratio by total reflection is generally high in a compound semiconductor layer but light having a low wavelength range can be effectively extracted by the light extraction structure 90.

Figure 3:
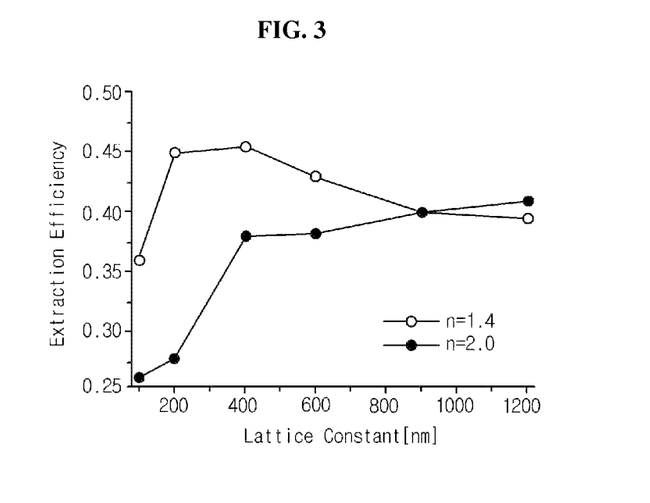
FIG. 3 is a graph illustrating a change of light extraction efficiency of the light emitting device according to a refractive index of the pattern.

FIG. 3 is a graph illustrating light extraction efficiency of the light emitting device according to a refractive index of the pattern 80.

The x-axis of FIG. 3 represents a lattice constant of the pattern 80 and its y-axis represents a light extraction efficiency of the light extraction structure 90. This experiment is performed under the same condition as FIG. 2.

Referring to FIG. 3, like the experimental result of FIG. 2, when a refractive index of the pattern 80 is as low as 1.4, it has high light extraction efficiency compared to a refractive index of 2.0.

Especially, the light extraction efficiency of when a period of the pattern 80 is between 200 nm to 600 nm is significantly higher if a refractive index of the pattern 80 is lower (when compared to a high refractive index). This, like the experimental result of FIG. 2, means that efficiency of low order guided mode can be improved according to a period and material of the pattern 80.

Moreover, a material of the pattern 80 having a value close to a refractive index of 1.4 may include $MgF_2$ and SOG and a material having a value close to a refractive index of 2.0 may include ITO. A material having a value close to a refractive index of 2.5 may include $TiO_2$. However, materials of the present invention are not limited thereto.

Figure 4:
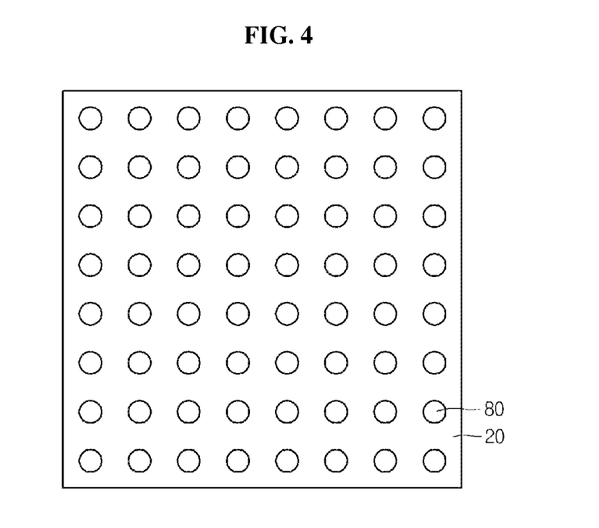
FIGS. 4 and 5 are plan views of the light extraction structure seen from the top.
Figure 5:
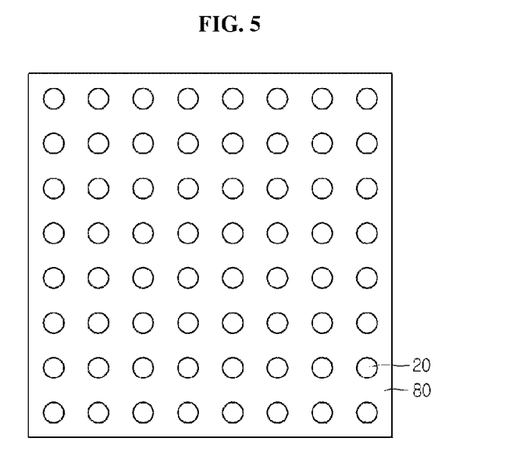

FIGS. 4 and 5 are plan views of the light extraction structure 90 seen from the top.

As shown in FIG. 4, the patterns 80 may be formed on the reflective layer 20 being spaced apart from each other. Or, as shown in FIG. 5, the reflective layer 20 may be formed on the pattern 80 being spaced apart from each other.

Moreover, although the light extraction structure 90 where the pattern 80 or the reflective layer 20 has a periodic column structure is shown, the pattern 80 or the reflective layer 20 may have a structure that is a polyprism, a polypyramid, or a truncated cone. The present invention is not limited thereto.

Referring to FIG. 1 again, the ohmic layer 25 may be formed on the light extraction structure 90. That is, the ohmic layer 25 may be formed on the pattern 80 and the reflective layer 20.

The ohmic layer 25 may form ohmic contact between the second electrode layer 10 and the second conductive type semiconductor layer 30 to allow current to smoothly flow between the two layers such that light emitting efficiency of the light emitting device can be improved.

For example, the ohmic layer 25 may include at least one of Ni, Pt, Cr, Ti, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$ and $RuO_x$.

Furthermore, when forming a metallic material, the ohmic layer 25 may be formed with a thickness of 1 nm to 30 nm. The reason is that when the metallic material is a thin layer, it has translucency such that the loss caused when light is absorbed by the ohmic layer 25 can be minimized. If the ohmic layer 25 is formed of a nonmetallic material having translucency, the thickness of the ohmic layer 25 may be between 10 nm to 300 nm.

The second conductive type semiconductor layer 30 may be formed on the ohmic layer 25. The second conductive type semiconductor layer 30 may be realized with a p-type semiconductor layer, for example. The p-type semiconductor may be formed of a semiconductor material having a composition equation of $In_xAl_yGa_{1-x-y}N$ ($0 \leq x \leq 1$, $0 \leq y \leq 1$, $0 \leq x+y \leq 1$) such as InAlGaN, GaN, AlGaN, AlInN, InGaN, AlN, and InN and a p-type dopant such as Mg, Zn, Ca, Sr, and Ba may be doped into the p-type semiconductor layer.

The active layer 40 may be formed on the second conductive type semiconductor layer 30. The active layer 40 may be formed of a semiconductor material having a composition equation of $In_xAl_yGa_{1-x-y}N$ ($0 \leq x \leq 1$, $0 \leq y \leq 1$, $0 \leq x+y \leq 1$) and also may be formed with a single quantum well structure, multi quantum well (MQW) structure, a quantum dot structure, or a quantum line structure.

The active layer 40 may generate light through energy that is generated during a recombination process of electrons and holes provided from the first conductive type semiconductor layer 50 and the second conductive type semiconductor layer 30.

The first conductive type semiconductor layer 50 may be formed on the active layer 40. The first conductive type semiconductor layer 50 may include a n-type semiconductor layer, for example. The n-type semiconductor layer is formed of a semiconductor material having a composition equation of $In_xAl_yGa_{1-x-y}N$ ($0 \leq x \leq 1$, $0 \leq y \leq 1$, $0 \leq x+y \leq 1$) such as InAlGaN, GaN, AlGaN, AlInN, InGaN, AlN, and InN and a n-type dopant such as, Si, Ge, Sn may be doped into the n-type semiconductor layer.

In addition, a n-type or p-type semiconductor layer may be further formed below the second conductive type semiconductor layer 30. Moreover, the first conductive type semiconductor layer 50 may be realized with a p-type semiconductor layer and the second conductive type semiconductor layer 30 may be realized with a n-type semiconductor layer. Accordingly, the light emitting device may include at least one of np junction, pn junction, npn junction, and pnp junction structures. The present invention is not limited thereto.

The un-doped semiconductor layer 60 may be formed on the first conductive type semiconductor layer 50. The un-doped semiconductor layer 60 means a semiconductor layer having a significantly low electrical conductivity compared to the first conductive type semiconductor layer 50 and the second conductive type semiconductor layer 30. For example, the un-doped semiconductor layer 60 may be an un-doped GaN layer.

The first electrode layer 70 may be formed on the first conductive type semiconductor layer 50. The first electrode layer 70 may include at least one of Al, Ti, Cr, Ni, Cu, and Au and may have a single or multi layered structure. Moreover, the first electrode layer 70 may provide power from an external power to the light emitting device through wire.

Hereinafter, a method of manufacturing a light emitting device according to the first embodiment will be described in more detail.

FIGS. 6 through 11 are views illustrating a method of manufacturing a light emitting device according to the first embodiment.

Figure 6:
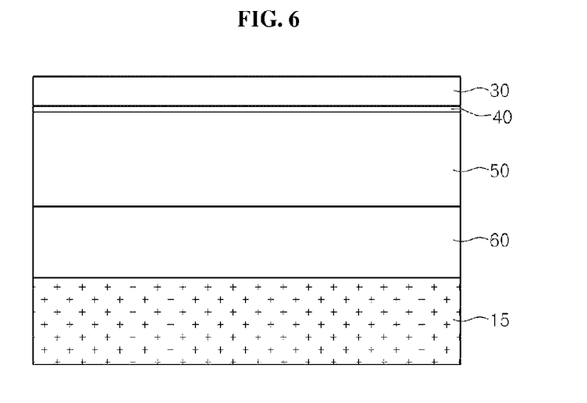
FIGS. 6 through 11 are views illustrating a method of manufacturing a light emitting device according to the first embodiment.

Referring to FIG. 6, the un-doped semiconductor layer 60, the first conductive type semiconductor layer 50, the active layer 40, and the second conductive type semiconductor layer 30 may sequentially be grown and formed on the growth substrate 15.

The growth substrate 15 may be formed of at least one of $Al_2O_3$, SiC, GaAs, GaN, ZnO, Si, GaP, InP, and Ge and is not limited thereto.

For example, the layers are formed using methods such as Metal Organic Chemical Vapor Deposition (MOCVD), Chemical Vapor Deposition (CVD), Plasma-Enhanced Chemical Vapor Deposition (PECVD), Molecular Beam Epitaxy (MBE), and Hydride Vapor Phase Epitaxy (HVPE). The present invention is not limited thereto.

In addition, a buffer layer (not shown) may be formed between the first conductive type semiconductor layer 50 and the growth substrate 15 to alleviate a lattice constant difference.

Figure 7:
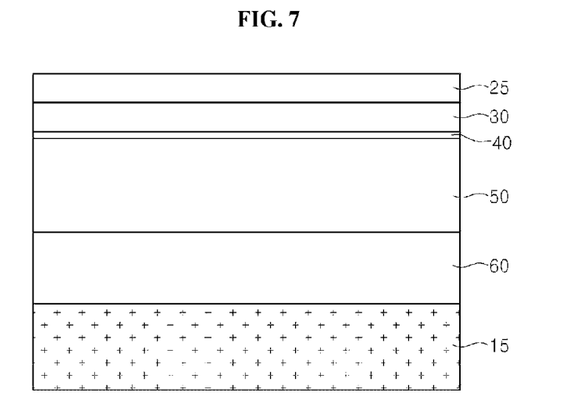

Referring to FIG. 7, the ohmic layer 25 may be formed on the second conductive type semiconductor layer 30.

The ohmic layer 25 may be formed using methods such as Plasma Enhanced Chemical Vapor Deposition (PECVD), E-beam deposition, and sputtering deposition.

Figure 8:
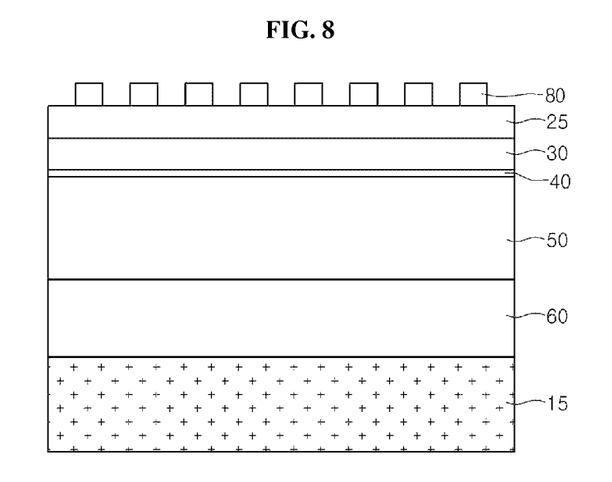

Referring to FIG. 8, the pattern 80 may be formed on the ohmic layer 25.

After forming a nonmetallic layer, the pattern 80 may be formed by patterning the nonmetallic layer. Or, after forming a mask pattern that corresponds to the pattern 80, the pattern 80 may be formed by performing a deposition or plating process along the mask pattern.

Figure 9:
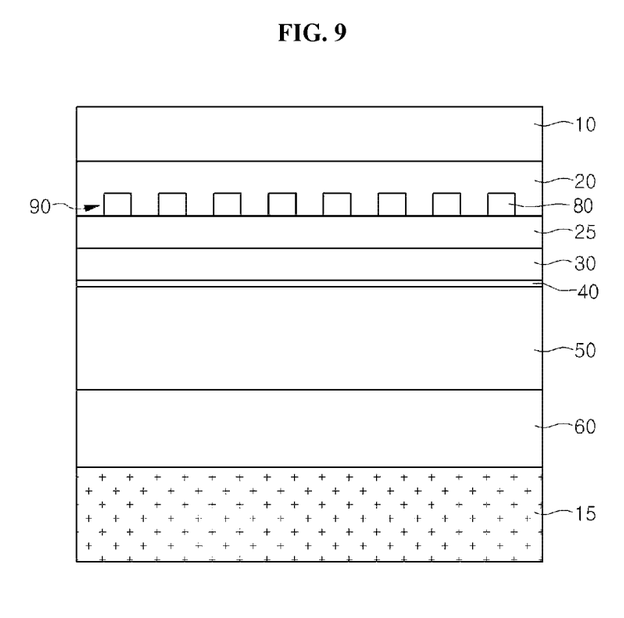

Referring to FIG. 9, the reflective layer 20 is formed on the ohmic layer 25 and the pattern 80 such that a light extraction structure 90 is formed, and the second electrode layer 10 may be formed on the light extraction structure 90.

The reflective layer 20 may be formed through a plating or deposition process. The second electrode layer 10 may be formed through a plating or deposition process, or may be bonded on the reflective layer 20 after being previously prepared in sheet form.

Moreover, a junction metal layer (not shown) may be further formed between the second electrode layer 10 and the reflective layer 20 to improve interfacial adhesion.

Figure 10:
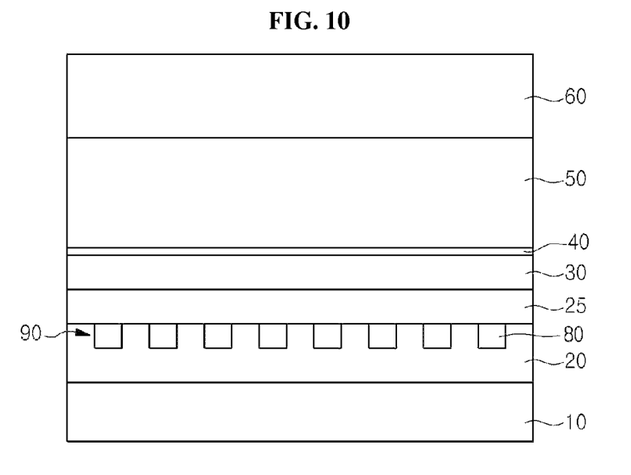

As shown in FIGS. 9 and 10, the growth substrate 15 may be removed.

The growth substrate 15 may be removed by a laser lift off (LLO) process or an etching process.

Here, a process for removing the growth substrate 15 and the following processes are performed on the bottom surface of the light emitting device of FIG. 9. Thus, the light emitting device of FIG. 9 will be described in FIGS. 10-13 with an upside down form.

Figure 11:
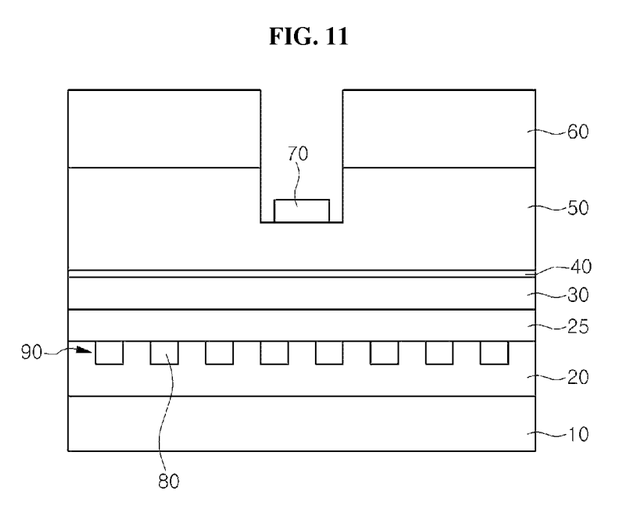

Referring to FIGS. 10 and 11, after an etching process is performed to at least partially expose the top surface of the first conductive type semiconductor layer 50, the first electrode layer 70 is formed on the exposed first conductive type semiconductor layer 50, such that a light emitting device according to the first embodiment can be provided.

Figure 12:
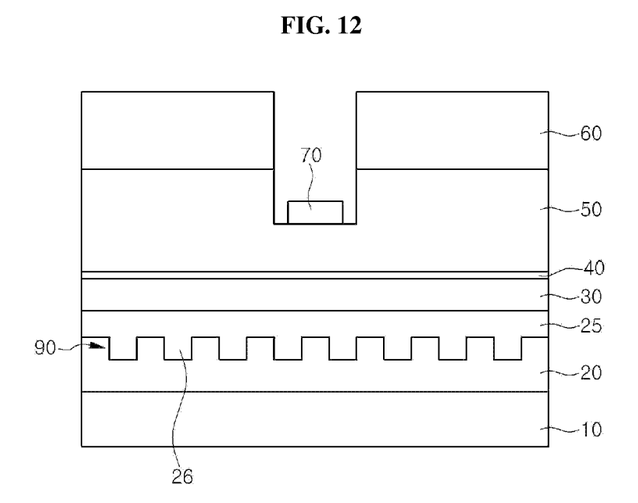
FIG. 12 is a view illustrating the light emitting device according to the second embodiment.

FIG. 12 is a view illustrating the light emitting device according to the second embodiment. However, overlapping description with respect to the second embodiment will be omitted.

Referring to FIG. 12, the light emitting device according to the second embodiment includes a second electrode layer 10, a reflective layer 20 on the second electrode layer 10, an ohmic layer 25 with a protruding pattern 26 on the ohmic layer 25, an active layer 40 on the second conductive type semiconductor layer 30, a first conductive type semiconductor layer 50 on the active layer 40, and a first electrode layer 70 on the first conductive type semiconductor layer 50.

Moreover, an un-doped semiconductor layer 60 may be formed on the first conductive type semiconductor layer 50.

In the light emitting device of the second embodiment, the protruding pattern 26 of the ohmic layer 25 and the reflective layer 20 form a light extraction structure 90.

The protruding pattern 26 protrudes toward the reflective layer 20 and may be formed being spaced a predetermined interval apart from each other. That is, the protruding pattern 26 is formed and its bottom surface and the side surface contact the reflective layer 20.

The protruding pattern 26 may be formed after forming of the ohmic layer 25 and selectively etching of the ohmic layer 25, but is not limited thereto. The protruding pattern 26 is one kind of a pattern of the first embodiment.

The light extraction structure 90 includes the protruding pattern 26 of the ohmic layer 25 and the reflective layer 20, which is a metal minor contacting the protruding pattern 26.

Figure 13:
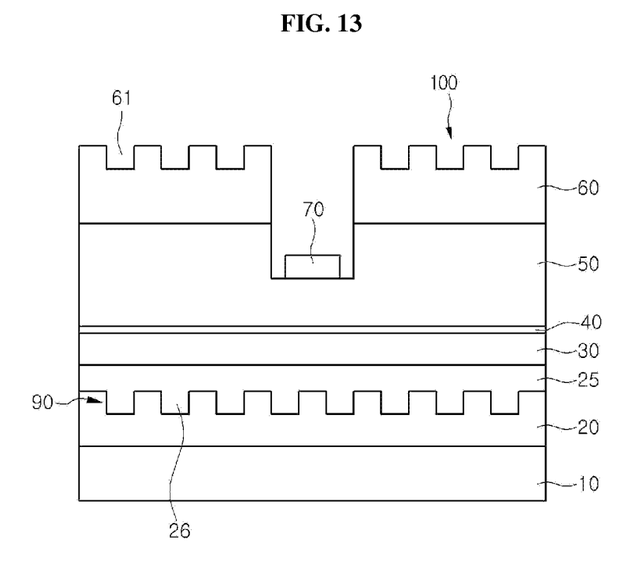
FIG. 13 is a view illustrating a light emitting device according to a third embodiment.

FIG. 13 is a view illustrating a light emitting device according to a third embodiment. However, overlapping description with respect to the first embodiment will be omitted.

Referring to FIG. 13, the light emitting device according to the third embodiment includes a second electrode layer 10, a reflective layer 20 on the second electrode layer 10, a pattern 80 on the reflective layer 20, an ohmic layer 25 on the reflective layer 20 and the pattern 80, a second conductive type semiconductor layer 30 on the ohmic layer 25, an active layer on the second conductive type semiconductor layer 30, a first conductive type semiconductor layer 50 on the active layer 40, a first electrode layer 70 on the first conductive type semiconductor layer 50, and an un-doped semiconductor layer 60 on the first conductive type semiconductor layer 50.

A second light extraction structure 100 is formed in the un-doped semiconductor layer 60. The second light extraction structure 100 could have a pillar or hole form. In this embodiment, a hole 61 is formed.

The hole 61 is disposed with a period of 50 nm to 3000 nm and selectively transmit light having a predetermined wavelength range, such that extraction efficiency of light emitted from the light emitting device can be improved.

Or, random roughness may be formed in the un-doped semiconductor layer 60 through a wet etching process, but is not limited thereto.

Furthermore, the second light extraction structure 100 is formed on the un-doped semiconductor layer 60 in the third embodiment, but this may be applied to the light emitting device of the second embodiment in the same manner.

Moreover, after removing the un-doped semiconductor layer 60, the second light extraction structure 100 may be formed on the first conductive type semiconductor layer 50. This may be applied to the second embodiment in the same manner.

Figure 14:
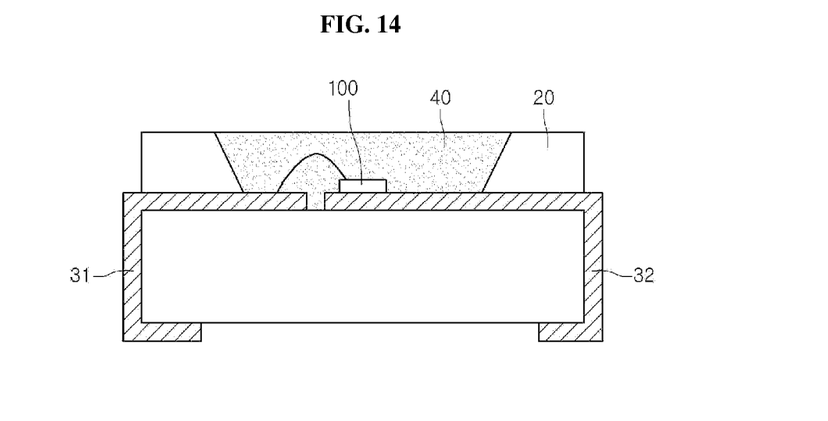
FIG. 14 is a sectional view of a light emitting device package including a light emitting device according to the embodiments.

FIG. 14 is a sectional view of a light emitting device package including a light emitting device according to embodiments.

Referring to FIG. 14, the light emitting device package includes a body 20, a first and second electrodes 31 and 32 installed at the body 20, a light emitting device 100 of the above embodiments, which is electrically connected to the first and second electrodes 31 and 32, and a molding member 40 surrounding the light emitting device 100.

The body 20 may be formed of silicon material, synthetic resin material, or metal material and an inclined plane may be formed around the light emitting device 100.

The first electrode 31 and the second electrode 32 are electrically separated from each other and provide power to the light emitting device 100. Moreover, the first and second electrodes 31 and 32 may be formed of metal or alloy, which may include at least one of Cu, Au, Ag, Al, Cr, Pd, Pt, or Ni and reflect light generated from the light emitting device 100 to increase light efficiency and also discharge heat generated from the light emitting device 100 to the outside.

The light emitting device 100 may be installed on the body 20 or may be installed on the first electrode 31 or the second electrode 32.

The light emitting device 100 may be electrically connected to the first electrode 31 and the second electrode 32 through a wire method, a flip chip method, or a die bonding method.

The molding member 40 surrounds and protects the light emitting device 100. Moreover, the molding member 40 includes a fluorescent material that may change wavelengths of light emitted from the light emitting device 100.

Figure 15:
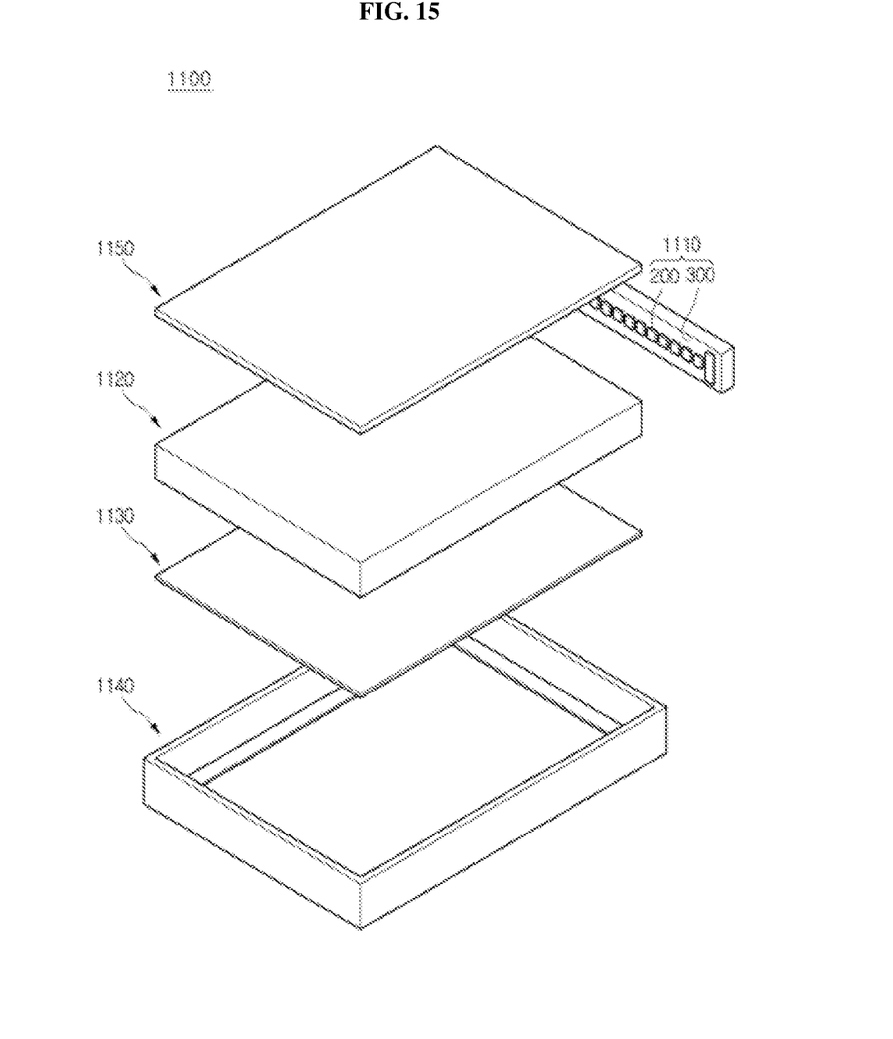
FIG. 15 is a view illustrating a backlight unit using the light emitting device package according to the embodiments.

FIG. 15 is a view illustrating a backlight unit using the light emitting device package of the embodiment. However, the backlight unit 1100 of FIG. 15 is just one example of a lighting system and is not limited thereto.

Referring to FIG. 15, the backlight unit 1100 includes a bottom frame 1140, a light guide member 1120 in the bottom frame 1140, and a light emitting module 1110 on at least one side or bottom of the light guide member 1120. Furthermore, a reflective sheet 1130 may be disposed below the light guide member 1120.

The bottom frame 1140 may be formed with a box of which top surface is open to accommodate the light emitting module 1110 and the reflective sheet 1130, and also may be formed of metal material or resin material but is not limited thereto.

The light emitting module 1110 may include a substrate and a plurality of light emitting device packages of the embodiments mounted on the substrate. The plurality of light emitting device packages may provide light to the light guide member 1120.

As shown in the drawing, the light emitting module 1110 may be disposed on at least one of the inner sides of the bottom frame 1140 and accordingly, may provide light to at least one of sides of the light guide member 1120.

However, the light emitting module 1110 is disposed below the bottom frame 1140 and thus may provide light toward the bottom of the light guide member 1120. This may vary according to designs of the backlight unit 1100. Therefore, the present invention is not limited thereto.

The light guide member 1120 may be disposed in the bottom frame 1140. The light guide member 1120 converts light provided from the light emitting module 1110 into plane light and guides it to a display panel (not shown).

The optical guide member 1120 may be a light guide panel (LGP). The light guide panel may be formed of at least one of acrylic resin series such as polymethyl metaacrylate (PMMA), polyethylene terephthlate (PET), polycarbonate (PC), COC and polyethylene naphthalate (PEN) resins.

An optical sheet 1150 may be disposed on the light guide member 1120.

The optical sheet 1150 may include at least one of a diffusion sheet, a condensing sheet, a brightness enhancement sheet, and a fluorescent sheet. For example, the optical sheet 1150 may be formed by stacking the diffusion sheet, the condensing sheet, the brightness rising sheet, and the fluorescent sheet. In this case, the diffusion sheet 1150 uniformly diffuses light emitted from the light emitting module 1110 and the diffused light is focused on the display panel (not shown) by the condensing sheet. Here, the light emitted from the condensing sheet is randomly polarized light, and the brightness enhancement sheet may increase the degree of polarization of the light emitted from the condensing sheet. The condensing sheet may be a parallel or/and vertical prism sheet. Moreover, the brightness enhancement sheet may be a dual brightness enhancement film. Furthermore, the fluorescent sheet may be a translucency plate or film including a fluorescent material.

The reflective sheet 1130 may be disposed below the light guide member 1120. The reflective sheet 1130 reflects the light emitted through the bottom of the light guide member 1120 toward the outgoing side of the light guide member 1120.

The reflective sheet 1130 may be formed of a resin material of excellent reflectivity such as PET, PC, or PVC resins, but is not limited thereto.

Figure 16:
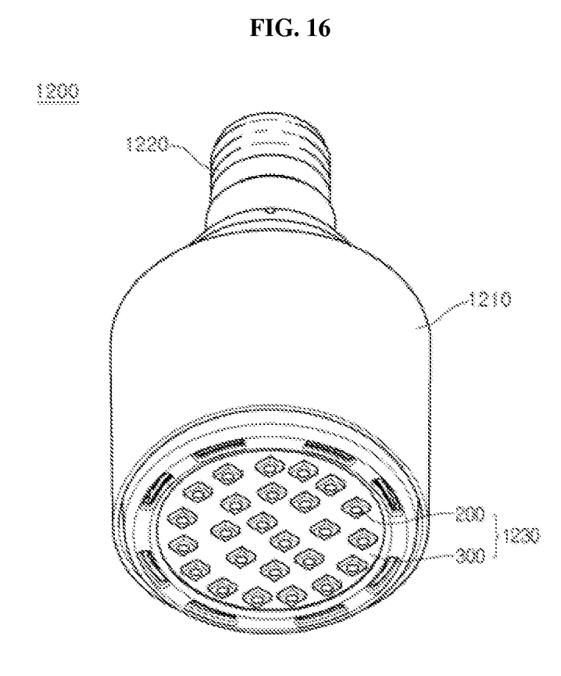
FIG. 16 is a perspective view of a lighting unit using the light emitting device package according to the embodiments.

FIG. 16 is a perspective view of a lighting unit using the light emitting device package according to the embodiments. However, the lighting unit of FIG. 16 is just one example and is not limited thereto.

Referring to FIG. 16, the lighting unit 1200 includes a case body 1210, a light emitting module 1230 installed at the case body 1210, and a connection terminal 1220 that is installed at the case body 1210 and receives power from the external power supply.

The case body 1210 may be formed of a material having an excellent protection against heat and thus may be formed of metal material or resin material.

The light emitting module 1230 may include a substrate 300 and a light emitting device package 200 mounted on the substrate, which is formed according to at least one of the above embodiments.

The substrate 300 may be one where a circuit pattern is printed on an insulator and may include a general printed circuit board (PCB), a metal core PCB, a flexible PCB, and a ceramic PCB.

Moreover, the substrate 300 may be formed of a material that efficiently reflects light or may be formed with color that reflects light efficiently such as white color and silver color.

The light emitting device package according to at least one of the above embodiments may be mounted on the substrate 300. Each light emitting device package 200 may include at least one light emitting diode (LED). The LED may include colored LEDs for emitting colors of red, green, blue, or white and an ultraviolet (UV) LED emitting UV.

The light emitting module 1230 may be arranged to have various kinds of LED combinations to obtain colors and brightness. For example, in order to obtain high color rendering index (CRI), white color LED, red color LED, and green color LED may be combined and disposed. Moreover, a fluorescent sheet may be further disposed on a progressing path of light emitted from the light emitting module 1230 and the fluorescent sheet may change a wavelength of the light emitted from the light emitting module 1230. For example, if the light emitted from the light emitting module 1230 has a blue color wavelength range, a yellow fluorescent material may be included in the fluorescent sheet and the light emitted from the light emitting module 1230 is displayed as a white color light finally after passing through the fluorescent sheet.

The connection terminal 1220 is electrically connected to the light emitting module 1230 to provide its power. As shown in FIG. 16, the connection terminal 1220 is spirally combined into the external power supply with a socket type but is not limited thereto. For example, the connection terminal 1220 is formed with a pin form and is inserted into the external power supply, or may be connected to the external power supply through wiring.

As mentioned above, in relation to the lighting system, at least one of a light guide member, a diffusion sheet, a condensing sheet, a brightness enhancement sheet, and a fluorescent sheet is disposed on the progressing path of light emitted from the light emitting module, such that the desired optical effect can be achieved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a second electrode layer;
a reflective layer on the second electrode layer;
a first light extraction structure including the reflective layer and a protruding pattern;
an ohmic layer on the first light extraction structure;
a second conductive type semiconductor layer on the ohmic layer;
an active layer on the second conductive type semiconductor layer;
a first conductive type semiconductor layer on the active layer; and
a first electrode layer on the first conductive type semiconductor layer,
wherein the protruding pattern has a refractive index that is higher than that of air and lower than that of the second conductive type semiconductor layer,
wherein the ohmic layer and the protruding pattern have the same material,
wherein the protruding pattern is formed of at least one selected from the group consisting of GZO, RuOx, and IrOx, and
wherein the first electrode layer is disposed below a top most surface of the first conductive type semiconductor layer.

2. The light emitting device according to claim 1, comprising an un-doped semiconductor layer on the first conductive type semiconductor layer.

3. The light emitting device according to claim 2, further comprising:
   a second light extraction structure formed on the un-doped semiconductor layer; and
   a first electrode layer formed on the first conductive type semiconductor layer through the un-doped semiconductor layer,
   wherein a bottom surface of the second light extraction structure is higher than a top surface of the first electrode layer.

4. The light emitting device according to claim 1, wherein a bottom and a side of the protruding pattern are surrounded by the reflective layer.

5. The light emitting device according to claim 1, wherein the protruding pattern is formed of a translucent electrode.

6. The light emitting device according to claim 1, wherein a period of the protruding pattern is a range between about 200 nm to about 600 nm.

7. The light emitting device according to claim 1, wherein a refractive index of the protruding pattern is less than that of the ohmic layer.

8. A light emitting device package comprising:
   a package body;
   a first electrode layer and a second electrode layer installed at the package body; and
   a light emitting device of claim 1 connected electrically to the first electrode layer and the second electrode layer.

9. A lighting system comprising:
   a substrate; and
   a light emitting module including a light emitting device of claim 1 installed at the substrate.

10. The light emitting device of claim 1, wherein the protruding pattern protrudes from the ohmic layer and protrudes toward the reflective layer.

11. The light emitting device of claim 1, wherein a bottom surface and a side surface of the protruding pattern contact the reflective layer.

12. The light emitting device of claim 1, wherein the reflective layer comprises a second protruding pattern corresponding to the protruding pattern.

13. The light emitting device according to claim 1, wherein the ohmic layer is formed of a material used for ohmic contact with the second conductive type semiconductor layer.

14. The light emitting device according to claim 13, wherein when the ohmic layer is formed of a metallic material, a thickness of the ohmic layer is about 1 nm to about 30 nm.

15. The light emitting device according to claim 13, wherein when the ohmic layer is formed of a nonmetallic material, a thickness of the ohmic layer is about 10 nm to about 300 nm.

* * * * *